United States Patent
Furudate

(10) Patent No.: US 8,971,472 B2
(45) Date of Patent: Mar. 3, 2015

(54) SIGNAL PROCESSING CIRCUIT AND METHOD

(71) Applicant: Fujitsu Limited, Kawasaki-shi, Kanagawa (JP)

(72) Inventor: Hideki Furudate, Ota (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 14/082,918

(22) Filed: Nov. 18, 2013

(65) Prior Publication Data
US 2014/0211899 A1    Jul. 31, 2014

(30) Foreign Application Priority Data
Jan. 25, 2013   (JP) ................................ 2013-012162

(51) Int. Cl.
*H03D 3/24*   (2006.01)
*H04B 1/00*   (2006.01)
*H04L 27/38*   (2006.01)

(52) U.S. Cl.
CPC .. *H04B 1/00* (2013.01); *H04L 27/38* (2013.01)
USPC ........... 375/376; 375/350; 375/340; 370/328; 370/252

(58) Field of Classification Search
USPC ................... 375/376, 350, 340; 370/328, 252
See application file for complete search history.

(56) References Cited

U.S. PATENT DOCUMENTS

| | | | |
|---|---|---|---|
| 6,711,219 B2* | 3/2004 | Thomas et al. ............... | 375/346 |
| 7,215,700 B2* | 5/2007 | Currivan et al. .............. | 375/148 |
| 2006/0245509 A1* | 11/2006 | Khan et al. .................... | 375/260 |
| 2010/0195543 A1* | 8/2010 | Jung et al. ..................... | 370/279 |

FOREIGN PATENT DOCUMENTS

| | | |
|---|---|---|
| JP | 2009-188602 | 8/2009 |
| JP | 2010-226512 | 10/2010 |

* cited by examiner

*Primary Examiner* — Eva Puente
(74) *Attorney, Agent, or Firm* — Fujitsu Patent Center

(57) ABSTRACT

A signal processing circuit includes a PLL circuit configured to lock to a frequency contained in an input signal, a signal generating circuit configured to detect a direct-current component of a signal that is obtained by shifting frequencies of the input signal by a displacement equal to the locked frequency, and to generate a signal that has an amplitude responsive to the detected direct-current component and that has the same frequency and phase as a signal component of the locked frequency of the input signal, and a subtraction circuit configured to subtract the signal generated by the signal generating circuit from the input signal.

8 Claims, 7 Drawing Sheets

SIGNAL PROCESSING CIRCUIT AND METHOD

CROSS-REFERENCE TO RELATED APPLICATIONS

The present application is based upon and claims the benefit of priority from the prior Japanese Patent Application No. 2013-012162 filed on Jan. 25, 2013, with the Japanese Patent Office, the entire contents of which are incorporated herein by reference.

FIELD

The disclosures herein generally relate to signal processing circuits, and particularly relate to a signal processing circuit used in a receiver apparatus.

BACKGROUND

In a receiver used in communication systems, an interference signal (i.e., spurious signal) that is different from the transmitted signal may be mixed in the received signal. The spurious signal may emanate from another equipment, or may emanate from another signal source (e.g., clock system) situated in the receiver. The fact that quality of the received signal degrades due to the spurious signal may necessitate reduction of the effect of a spurious signal. A spurious signal is often an unmodulated wave signal or a narrowband modulated signal. Once the frequency position of the spurious signal is detected, the spurious signal may be reduced by suppressing the signal component at the detected frequency position.

A PLL (phase locked loop) circuit may lock to an unmodulated or narrowband modulated wave component mixed in a received signal, thereby detecting the frequency position of a spurious signal. A signal received by an antenna is converted into a received baseband digital signal by an RF circuit and an ADC (i.e., analog-to-digital converter). In the case of the position of the spurious frequency being roughly known, a PLL circuit is oscillated at this frequency position to supply the generated sinusoidal wave signal to a rotor. The rotor shifts the entirety of frequencies of the received digital signal such that the spurious frequency is situated at around 0 Hz, with the PLL circuit locking to the spurious frequency. The shifted received digital signal is supplied to a loop filter, which then generates a direct-current offset component responsive to the magnitude of the spurious signal. Subtraction of the direct-current offset component from the frequency-shifted received digital signal prior to being supplied to the loop filter serves to remove the spurious component. The received digital signal from which the spurious component is removed is input into a reverse rotor, which shifts the entirety of frequencies in an opposite direction to bring them back to the original frequency band. Decoding in accordance with the employed communication system is then performed with respect to the received digital signal.

In the case of the spurious frequency being not known, a frequency sweeper controls the NCO (i.e., numerically controlled oscillator) of the PLL circuit to gradually change the oscillating frequency. The sinusoidal wave signal generated by the NCO is supplied to the rotor and the reverse rotor. When the frequency specified by the frequency sweeper is situated near the spurious frequency, the loop filter of the PLL circuit outputs a direct-current offset component. The NCO is oscillated in response to the output of the loop filter, so that the PLL circuit locks to the spurious signal. As a result, the NCO can continuously supply a sinusoidal wave signal synchronized with the frequency and phase of the spurious signal to the rotor and the reverse rotor.

In the above-noted configuration, the signal waves are subjected to the frequency shift and reverse frequency shift that are provided by the rotor and the reverse rotor, respectively. Such shifts are made by using a limited number of bits representing the digital signals, resulting in a slight degradation of the signal waves due to the shift processes. When there is only one spurious wave, one frequency shift operation and one reverse frequency shift operation are all that is necessary. Degradation of signal waves in this case thus has only a small effect on the quality of received signals. When there are a plurality of spurious waves, however, frequency shift operations and reverse frequency shift operations as many as the number of spurious waves are performed. In such a case, the degradation of signal waves can no longer be ignored, resulting in degradation in the quality of received signals.

[Patent Document 1] Japanese Laid-open Patent Publication No. 2009-188602

[Patent Document 2] Japanese Laid-open Patent Publication No. 2010-226512

SUMMARY

According to an aspect of the embodiment, a signal processing circuit includes a PLL circuit configured to lock to a frequency contained in an input signal, a signal generating circuit configured to detect a direct-current component of a signal that is obtained by shifting frequencies of the input signal by a displacement equal to the locked frequency, and to generate a signal that has an amplitude responsive to the detected direct-current component and that has the same frequency and phase as a signal component of the locked frequency of the input signal, and a subtraction circuit configured to subtract the signal generated by the signal generating circuit from the input signal.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments of the invention will be described with reference to the accompanying drawings.

Figure 1:
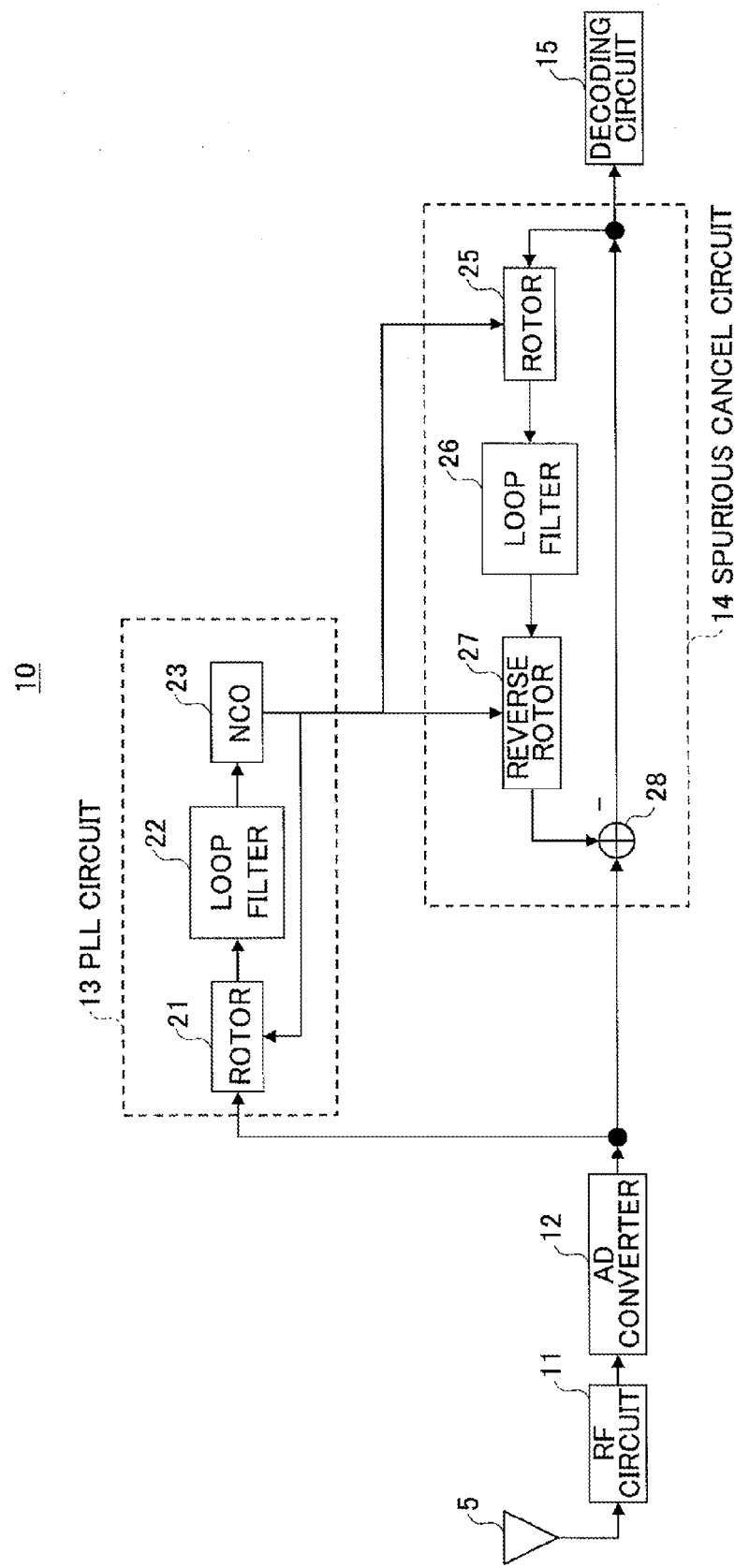
FIG. 1 is a drawing illustrating an example of the configuration of a signal processing circuit.

FIG. 1 is a drawing illustrating an example of the configuration of a signal processing circuit. The signal processing circuit illustrated in FIG. 1 serves to process a received signal in a receiver of a communication system. A description of the signal processing circuit will be given by using a receiver as an example in the following description. However, application of the signal processing circuit disclosed herein is not limited to a receiver of a communication system.

The signal processing circuit 10 includes an RF circuit 11, an AD converter (ADC) 12, a PLL circuit 13, a spurious cancel circuit 14, and a decoding circuit 15. The PLL circuit 13 includes a rotor 21, a loop filter 22, and an NCO 23. The spurious cancel circuit 14 includes a rotor 25, a loop filter 26, a reverse rotor 27, and a subtraction circuit 28.

In FIG. 1 and the subsequent drawings, boundaries between circuit blocks illustrated as boxes basically indicate functional boundaries, and may not correspond to separation in terms of physical positions, separation in terms of electrical signals, separation in terms of control logic, etc. Each circuit block may be a hardware module that is physically separated from other blocks to some extent, or may indicate a function in a hardware module in which this and other blocks are physically combined together.

A signal received by an antenna 5 is supplied to the RF circuit 11. The RF circuit 11 converts the received signal supplied from the antenna into a baseband signal, which is then output therefrom. The AD converter 12 converts the baseband received signal output from the RF circuit 11 into a digital signal.

The PLL circuit 13 locks to a certain frequency of the input signal (i.e., digital baseband received signal). Specifically, the NCO 23 for generating an oscillating signal (i.e., a sinusoidal wave signal) oscillates at an initial position that is near the frequency position of a spurious frequency, which may be known. The rotor 21 (i.e., frequency shift circuit) shifts the entirety of frequencies of the input signal such that the frequency position at which the NCO 23 oscillates becomes the direct current component. Namely, the input signal is frequency-shifted by a displacement equal to the frequency of the oscillating signal of the NCO 23. The loop filter 22 receives the output of the rotor 21. The loop filter 22 integrates the shifted input signal to detect the direct current component of the shifted input signal, and supplies the integrated value to the NCO 23 as a feedback. Based on the feedback value, the NCO 23 adjusts its oscillating frequency to generate an oscillating signal responsive to the output of the loop filter 22, thereby locking to the unmodulated or narrowband modulated wave (i.e., spurious signal) situated close to the initial position. With this arrangement, the rotor 21 shifts the entirety of frequencies of the received signal so that the locked frequency (i.e., spurious frequency) becomes a direct current component.

The spurious cancel circuit 14 receives the sinusoidal wave signal generated by the NCO 23 of the PLL circuit 13, and subtracts a signal responsive to the sinusoidal wave signal from the input signal to remove the spurious signal. The decoding circuit 15 receives the digital baseband received signal from which the spurious signal is removed by the spurious cancel circuit 14, and performs a decoding process on the received signal in accordance with the employed communication method.

The spurious cancel circuit 14 includes a signal generating circuit and the subtraction circuit 28. The signal generating circuit includes the rotor 25, the loop filter 26, and the reverse rotor 27. The signal generating circuit detects a direct-current component of the signal that is obtained by shifting the frequencies of the input signal by a distance equal to the locked frequency, thereby generating a signal that has an amplitude responsive to the direct-current component and that has the same frequency and phase as the locked frequency component of the input signal. To be specific, the NCO 23 of the PLL circuit 13 supplies to the rotor 25 an oscillating signal (i.e., sinusoidal wave signal) having the same frequency and phase as the locked frequency component of the input signal. Based on the sinusoidal wave signal generated by the NCO 23 of the PLL circuit 13, the rotor 25 (i.e., first frequency-shift circuit) shifts the frequencies of the input signal (i.e., shifts the entirety of frequencies of the input signal) by a displacement equal to the frequency to which the PLL circuit 13 locks. The loop filter 26 that receives the output of the rotor 25 integrates the frequency-shifted signal to detect the direct-current component of the frequency-shifted signal. The magnitude of this direct-current component is responsive to the amplitude of the spurious component.

Based on the oscillating signal of the NCO 23 of the PLL circuit 13, the reverse rotor 27 (i.e., second frequency-shift circuit) shifts the frequencies of the output of the loop filter 26 by a displacement equal to the locked frequency. In this manner, based on the sinusoidal wave signal generated by the NCO 23 of the PLL circuit 13, the reverse rotor 27 generates a signal that has an amplitude responsive to the direct-current component and that has the same frequency and phase as the locked frequency component of the input signal. The subtraction circuit 28 subtracts the signal generated by the signal generating circuit from the input signal, thereby removing the spurious component. Each of the rotor 25 and the reverse rotor 27 is a mixer that multiplies a target signal by the sinusoidal wave signal generated by the NCO 23, thereby shifting frequencies by multiplication.

The spurious cancel circuit 14 illustrated in FIG. 1 subtracts the sinusoidal wave signal equivalent to the spurious signal from the digital baseband received signal supplied from the AD converter 12 to remove the spurious signal. In this processing, the signal component corresponding to the spurious frequency, among all the signal components of the digital baseband received signal supplied from the AD converter 12, is processed, while all the remaining frequency components are unprocessed and supplied to the decoding circuit 15. Namely, processing such as the shifting of frequencies is not performed with respect to all the frequency components excluding the spurious frequency. The digital baseband received signal supplied to the decoding circuit 15 is thus not deteriorated compared with the digital baseband received signal supplied from the AD converter 12.

Figure 2:
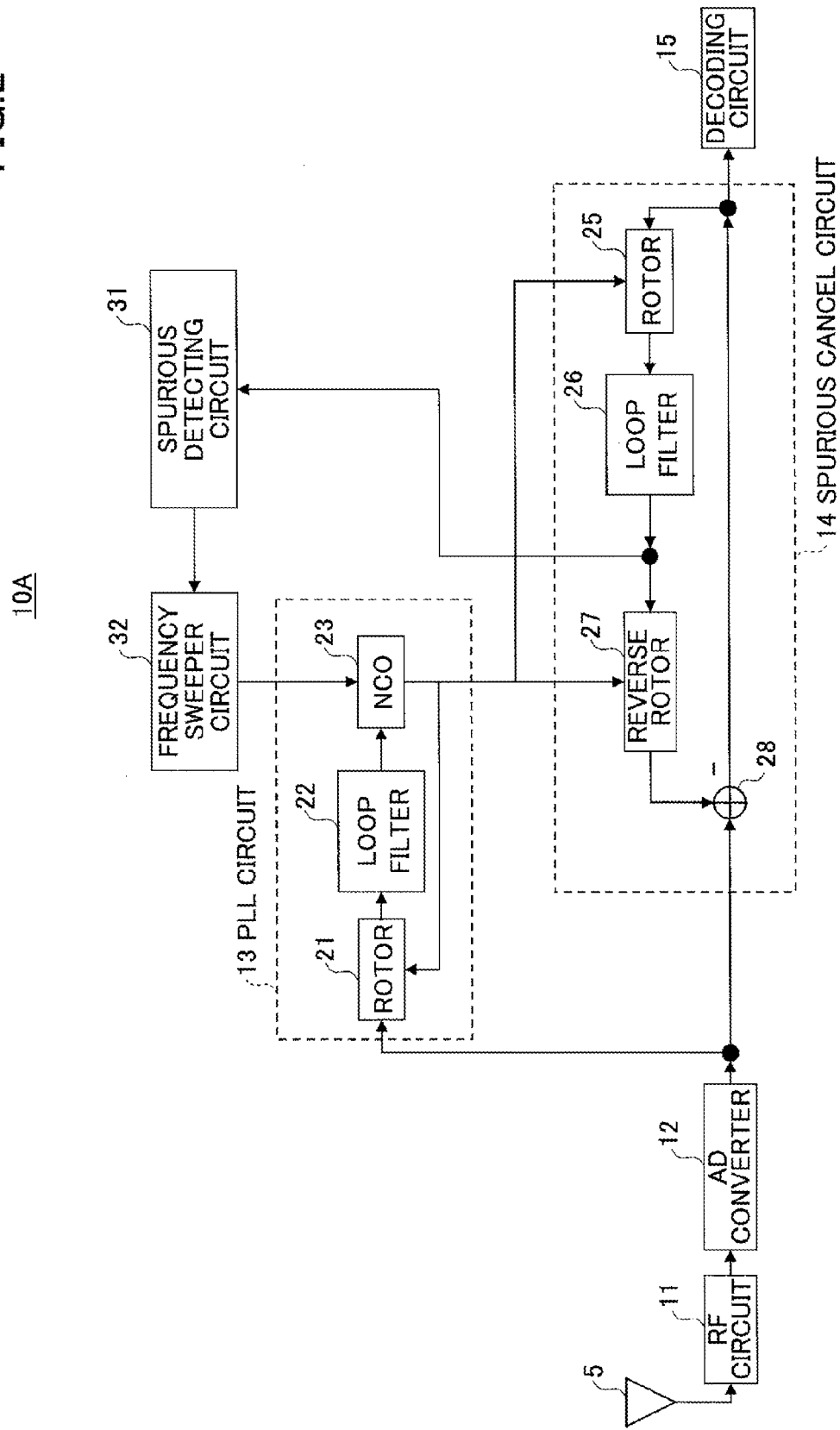
FIG. 2 is a drawing illustrating a variation of the signal processing circuit.

FIG. 2 is a drawing illustrating a variation of the signal processing circuit 10. The signal processing circuit 10A illustrated in FIG. 2 has a configuration in which a spurious detecting circuit 31 and a frequency sweeper circuit 32 are added to the signal processing circuit 10 illustrated in FIG. 1. Other configurations are the same between the signal processing circuit 10A illustrated in FIG. 2 and the signal processing circuit 10 illustrated in FIG. 1.

In the case of a spurious frequency being known, the signal processing circuit 10 illustrated in FIG. 1 successfully removes the spurious signal.

In the case of a spurious frequency being unknown, the frequency sweeper circuit 32 illustrated in FIG. 2 controls the oscillating frequency of the NCO 23 so as to gradually change the frequency within the frequency band of an expected received signal. That is, the frequency sweeper circuit 32 controls the NCO 23 of the PLL circuit 13 to gradually change the frequency of its oscillating signal. The NCO 23 oscillates at oscillating frequency responsive to a numerical value supplied thereto. The frequency sweeper circuit 32 gradually increases or decreases the numerical value supplied to the NCO 23, thereby increasing or decreasing the oscillating frequency.

The sinusoidal wave signal generated by the NCO 23 is supplied to the rotors 21 and 25 as well as to the reverse rotor 27. As the frequency specified by the frequency sweeper circuit 32 comes close to a spurious frequency, a direct-current component appears in the input signal whose frequencies are shifted by the rotor 25, with this direct-current component appearing in the output of the loop filter 26. In response to the occurrence of a loop-filter output being larger than a predetermined threshold, the spurious detecting circuit 31 asserts a detection signal to the frequency sweeper circuit 32. In response to the assertion of the detection signal, the frequency sweeper circuit 32 maintains the currently outputting numerical value as its output. The PLL circuit 13 operates in this state, so that the NCO 23 oscillates in response to a sum or the like of the numerical value supplied from the frequency sweeper circuit 32 and a numerical value output from the loop filter 22. Adjustment of the oscillating frequency of the NCO 23 according to the feedback operation of the PLL circuit 13 results in the PLL circuit 13 locking to the spurious frequency. In this locked state, the NCO 23 of the PLL circuit 13 generates a sinusoidal wave signal having the same frequency and phase as the spurious signal contained in the input signal.

Figure 3:
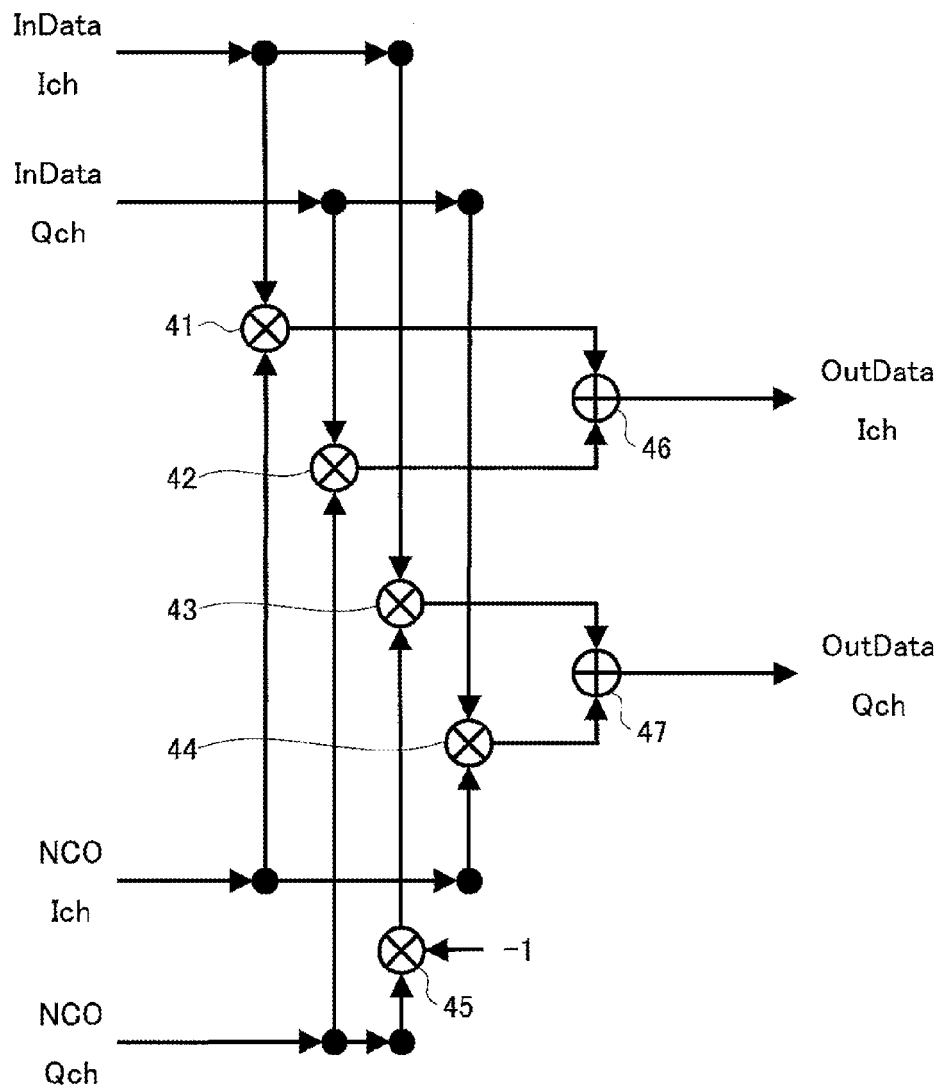
FIG. 3 is a drawing illustrating an example of the configuration of a rotor.

FIG. 3 is a drawing illustrating an example of the configuration of a rotor. Each of the rotors 21 and 25 illustrated in FIG. 1 may have the circuit configuration illustrated in FIG. 3.

The rotor includes multipliers 41 through 45 and adders 46 and 47. A signal input into the rotor includes an in-phase component InDataIch and a quadrature component InDataQch. The oscillating signal of the NCO 23 includes an in-phase component NCOIch and a quadrature component NCOQch. The rotor illustrated in FIG. 9 processes each signal as a complex signal, and calculates a product of the input signal and the complex conjugate of the oscillating signal of the NCO.

Figure 4:
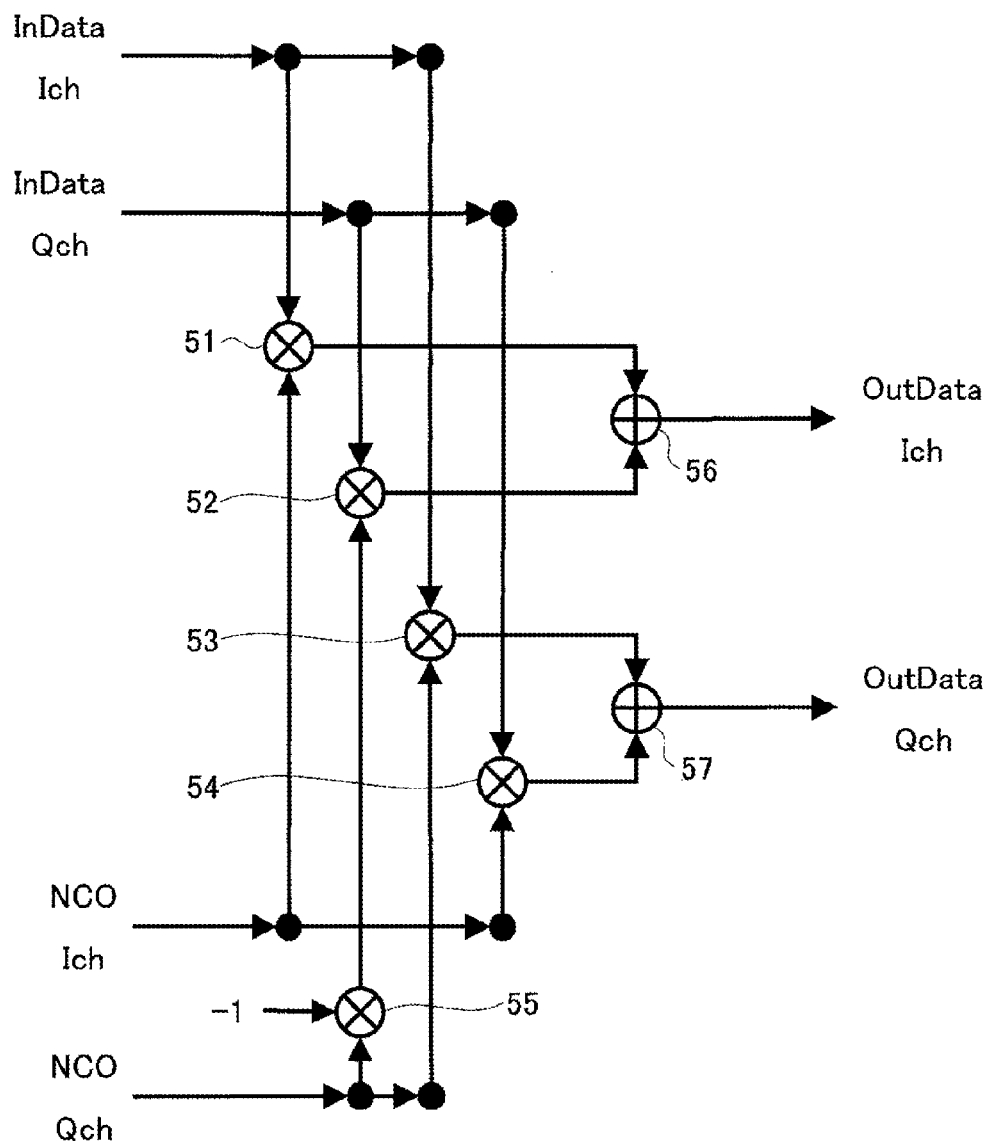
FIG. 4 is a drawing illustrating an example of the configuration of a reverse rotor.

FIG. 4 is a drawing illustrating an example of the configuration of a reverse rotor. The reverse rotor includes multipliers 51 through 55 and adders 56 and 57. A signal input into the reverse rotor includes an in-phase component InDataIch and a quadrature component InDataQch. The oscillating signal of the NCO 23 includes an in-phase component NCOIch and a quadrature component NCOQch. The rotor illustrated in FIG. 4 processes each signal as a complex signal, and calculates a product of the input signal and the oscillating signal of the NCO.

Figure 5:
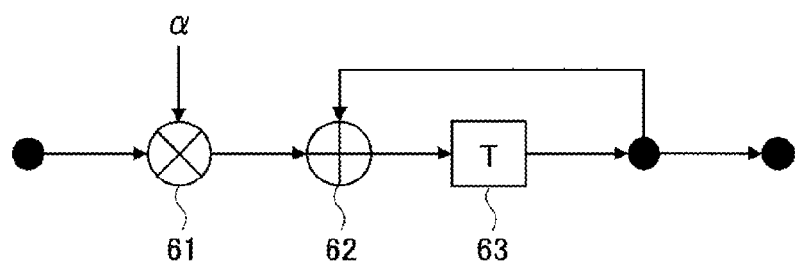
FIG. 5 is a drawing illustrating an example of the configuration of a loop filter.

FIG. 5 is a drawing illustrating an example of the configuration of a loop filter. Each of the loop filters 22 and 26 illustrated in FIG. 1 may have the circuit configuration illustrated in FIG. 5.

The loop filter includes a multiplier 61, an adder 62, and a delay element 63. The multiplier 61 multiplies the input value by a predetermined coefficient $\alpha$ that satisfies the condition of $0<\alpha<1$. The value of the coefficient $\alpha$ controls the passband of the loop filter. The adder 62 adds the output of the multiplier 61 to the output of the adder 62 that is output in the immediately preceding cycle. The delay element 63 delays the output of the adder 62 by one cycle. The output of the delay element 63 serves as the output of the loop filter.

In the case of the loop filter 26 illustrated in FIG. 1, the output of the loop filter changes (i.e., increases or decreases) from the initial value "0" step by step by each step value equal to $\alpha X$ in response to the input X of the loop filter that has a magnitude responsive to the amplitude of the spurious signal. With the output of the loop filter being equal to a level that exactly cancels the spurious signal, the input X of the loop filter is equal to zero, so that the output of the loop filter is maintained at a constant value, which results in the removal of the spurious signal. Upon a subsequent change in the amplitude of the spurious signal, the output of the loop filter changes accordingly. The output of the loop filter is then feedback-controlled such that the output of the loop filter becomes a level that exactly cancels the spurious signal.

In the case of the loop filter 22 illustrated in FIG. 1, a value that becomes zero when the oscillating signal of the NCO 23 and the spurious signal have the same frequency and phase, e.g., the quadrature component of the output of the rotor 21, may be used as the input into the loop filter. In response to the input Y of the loop filter, the output of the loop filter changes (i.e., increases or decreases) from the initial value "0" step by step by each step value equal to $\alpha Y$. Upon the oscillating signal of the NCO 23 responsive to the output of the loop filter being adjusted to have the same frequency and phase as the spurious component, the input Y of the loop filter becomes zero, resulting in the output of the loop filter being maintained at a constant value. The PLL circuit thus locks to the spurious component. Upon a subsequent change in the frequency or phase of the spurious signal, the output of the loop filter changes accordingly. The output of the loop filter is then feedback-controlled such that the output of the loop filter becomes a level that achieves locking to the spurious signal.

Figure 6:
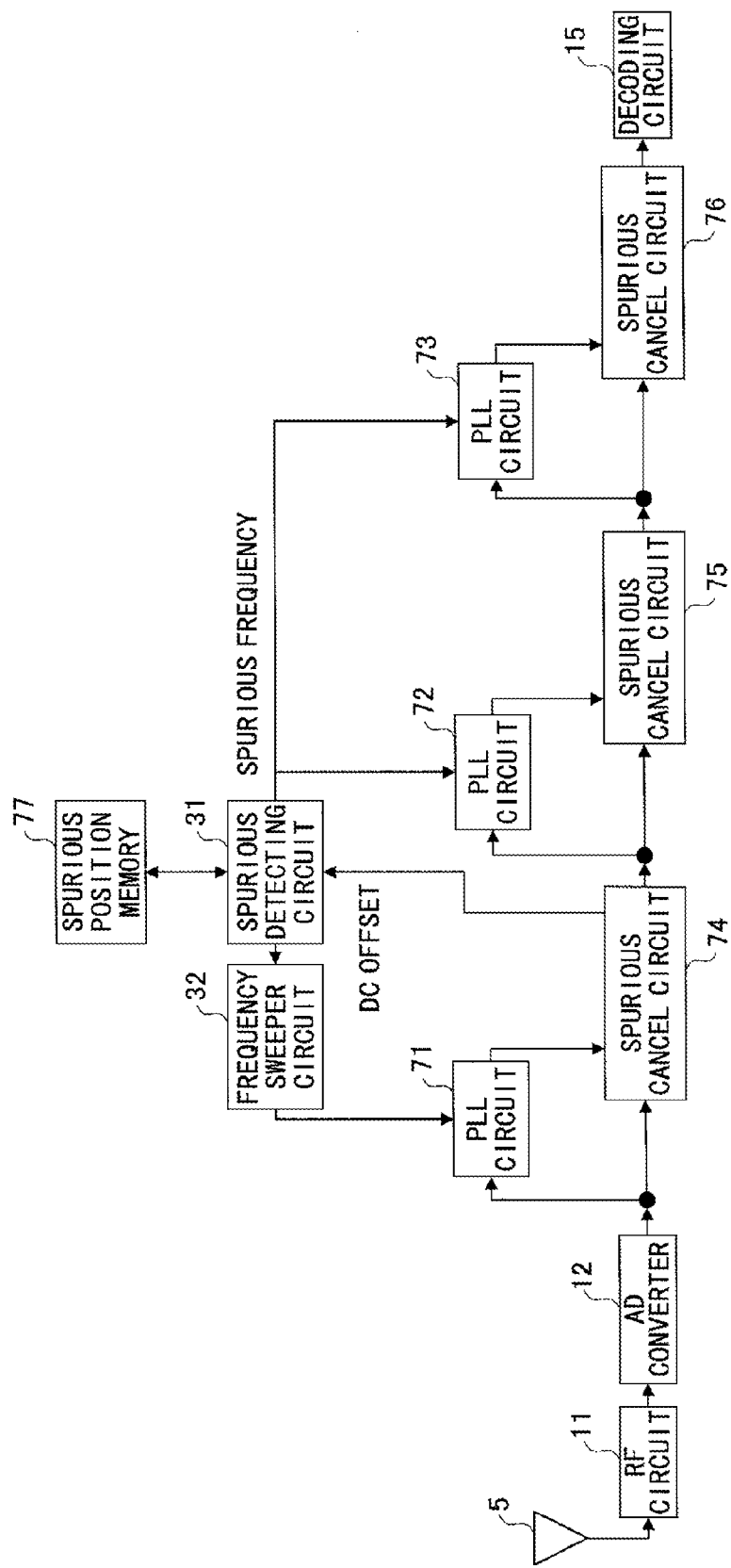
FIG. 6 is a drawing illustrating a variation of the signal processing circuit.

FIG. 6 is a drawing illustrating a variation of the signal processing circuit. The signal processing circuit illustrated in FIG. 6 removes spurious signals by use of a plurality of spurious cancel circuits connected in series when the spurious signals having different frequencies are included in a signal.

The signal processing circuit illustrated in FIG. 6 includes the RF circuit 11, the AD converter 12, the spurious detecting circuit 31, the frequency sweeper circuit 32, PLL circuits 71 through 73, spurious cancel circuits 74 through 76, and a spurious position memory 77. Each of the PLL circuits 71 through 73 may have the same configuration as the PLL circuit 13 illustrated in FIG. 1. Each of the spurious cancel circuits 74 through 76 may have the same configuration as the spurious cancel circuit 14 illustrated in FIG. 1. In the signal processing circuit illustrated in FIG. 6, the spurious detecting circuit 31 and the frequency sweeper circuit 32 are shared by a plurality of sets each including a PLL circuit and a spurious cancel circuit, rather than provided for each set including a PLL circuit and a spurious cancel circuit. A set of a PLL circuit and a spurious cancel circuit is regarded as a spurious removal circuit. A plurality (three in this example) of spurious removal circuits (71, 74), (72, 75), and (73, 76) are connected in series. The frequency sweeper circuit 32 is connected to the spurious removal circuit (71, 74) that is one of the plurality of spurious removal circuits. The frequency sweeper circuit 32 and the spurious cancel circuit 74 detect a plurality of frequency components that are to be removed by the spurious cancel circuits 74 through 76.

The frequency sweeper circuit 32 gradually changes (i.e., increases or decreases) the oscillating frequency of the NCO of the PLL circuit 71. When the frequency specified by the frequency sweeper circuit 32 comes close to a first spurious frequency, the output of the loop filter in the spurious cancel circuit 74 exceeds a predetermined threshold. Upon the occurrence of the loop-filter output being larger than the predetermined threshold, the spurious detecting circuit 31 stores the current output value (i.e., first spurious position) of the frequency sweeper circuit 32 in the spurious position memory 77.

The frequency sweeper circuit 32 then continues to gradually change (i.e., increases or decreases) the oscillating frequency of the NCO of the PLL circuit 71 from the oscillating frequency that is observed at the time the loop-filter output larger than the predetermined threshold appears as described above. When the frequency specified by the frequency sweeper circuit 32 comes close to a second spurious frequency, the output of the loop filter in the spurious cancel circuit 74 exceeds a predetermined threshold. Upon the occurrence of the loop-filter output being larger than the predetermined threshold, the spurious detecting circuit 31 stores the current output value (i.e., second spurious position) of the frequency sweeper circuit 32 in the spurious position memory 77.

Similarly, the frequency sweeper circuit 32 further changes the oscillating frequency of the NCO of the PLL circuits 71 through 73, so that the frequency specified by the frequency sweeper circuit 32 comes close to a third spurious frequency. In response, the output of the loop filter of the spurious cancel circuit 74 exceeds the predetermined threshold, which causes the current output value (i.e., third spurious position) of the frequency sweeper circuit 32 to be stored in the spurious position memory 77.

In the manner described above, frequency is gradually changed within the expected frequency band of a received signal, and the spurious positions are stored in the spurious position memory 77. In so doing, the magnitudes of the output values of the loop filter that exceed the predetermined threshold may be taken into account, and the spurious positions corresponding to these output values may be stored in memory as arranged in an ascending order of the magnitudes. Alternatively, the magnitudes of the output values of the loop filter that exceed the predetermined threshold may be taken into account, and the spurious positions corresponding to a predetermined number of largest output values (e.g., three in the configuration illustrated in FIG. 6) may be stored in memory.

In the following, a description will be given of a case in which components are removed at three spurious positions (i.e., the first through third spurious positions) in the ascending order of the outputs of the loop filter. The first spurious position read from the spurious position memory 77 is supplied to the NCO of the PLL circuit 71, thereby causing the NCO to oscillate around the first spurious frequency. The PLL circuit 71 operates, so that the NCO oscillates in response to a sum or the like of the numerical value supplied from the frequency sweeper circuit 32 and a numerical value output from the loop filter of the PLL circuit 71. Adjustment of the oscillating frequency of the NCO according to the feedback operation of the PLL circuit 71 results in the PLL circuit 71 locking to the first spurious frequency. In this locked state, the NCO of the PLL circuit 71 generates a sinusoidal wave signal having the same frequency and phase as the first spurious signal contained in the input signal. Based on this sinusoidal wave signal, the spurious cancel circuit 74 removes the first spurious frequency from the input signal.

Similarly, the second spurious position read from the spurious position memory 77 is supplied to the NCO of the PLL circuit 72, thereby causing the NCO to oscillate around the second spurious frequency. Adjustment of the oscillating frequency of the NCO according to the feedback operation of the PLL circuit 72 results in the PLL circuit 72 locking to the second spurious frequency. In this locked state, the NCO of the PLL circuit 72 generates a sinusoidal wave signal having the same frequency and phase as the second spurious signal contained in the input signal. Based on this sinusoidal wave signal, the spurious cancel circuit 75 removes the second spurious frequency from the input signal.

Similarly, the third spurious position read from the spurious position memory 77 is supplied to the NCO of the PLL circuit 73, thereby causing the NCO to oscillate around the third spurious frequency. Adjustment of the oscillating frequency of the NCO according to the feedback operation of the PLL circuit 73 results in the PLL circuit 73 locking to the third spurious frequency. Based on the sinusoidal wave signal generated by the NCO of the PLL circuit 73 in the locked state, the spurious cancel circuit 76 removes the third spurious frequency from the input signal.

Figure 7:
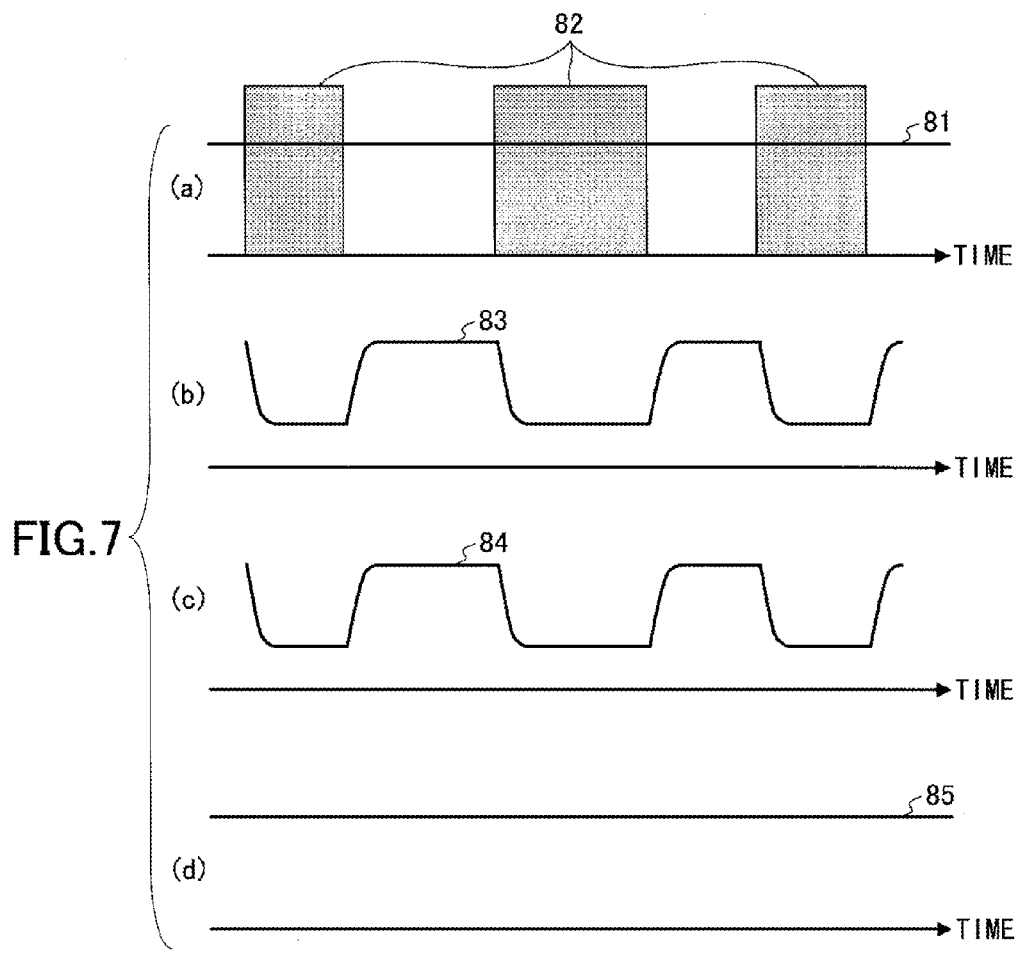
FIG. 7 is a drawing illustrating the gain control of a received signal in a receiver of a communication system.

FIG. 7 is a drawing illustrating the gain control of a received signal in a receiver of a communication system. Depending on the communication protocol used in a communication system, a signal may be transmitted periodically rather than transmitted as a temporally continuous signal. In such a case, the received signal takes a form of a burst signal having a signal value that appears periodically. The waveform of the power of this signal may be represented by a received burst signal power 82 illustrated in FIG. 7-(a).

On the other hand, a spurious signal may emanate from another equipment, or may emanate from another signal source (e.g., clock system) situated in the receiver, so that the spurious signal usually takes a form of an unmodulated signal or a narrow-band modulated signal. Accordingly, the power of a spurious signal usually has an approximately constant value in time as illustrated as a spurious power 81 in FIG. 7-(a).

In a receiver of a communication system, an AGC (i.e., automatic gain control unit) of the RF circuit performs automatic gain control to make the magnitude of the received signal equal to a proper constant value in order to dynamically cope with changes in signal attenuation occurring in the propagation path. This automatic gain control ensures that the magnitude of the received signal is set to a proper signal level in consideration of the dynamic range of an AD converter that performs AD conversion on the signal processed by the RF circuit. A gain waveform 83 illustrated in FIG. 7-(b) represents the magnitude of the gain set by the AGC with respect to the received signal having the burst signal power 82 illustrated in FIG. 7-(a). The gain waveform 83 assumes a relatively small value at positions where the burst signal power 82 is relatively strong, and assumes a relatively large value at positions where the burst signal power 82 is relatively small.

FIG. 7-(c) illustrates a spurious power 84 that is obtained by gain control performed by the AGC according to the gain waveform 83 when a spurious signal having the spurious power 81 (FIG. 7-(a)) is mixed in the received signal having the burst signal power 82 (FIG. 7-(a)). In automatic gain control, the spurious power 81 having a constant magnitude is multiplied by the gain waveform 83. As a result, the spurious power 84 obtained by the gain control ends up having large fluctuation as illustrated in FIG. 7-(c).

In the signal processing circuit illustrated in FIG. 1, FIG. 2, and FIG. 6, it is difficult for the PLL circuits to follow an input signal that has an amplitude with large fluctuation Further, it is also difficult for the spurious cancel circuits to remove a spurious signal by properly following the input signal that has an amplitude with large fluctuation.

Figure 8:
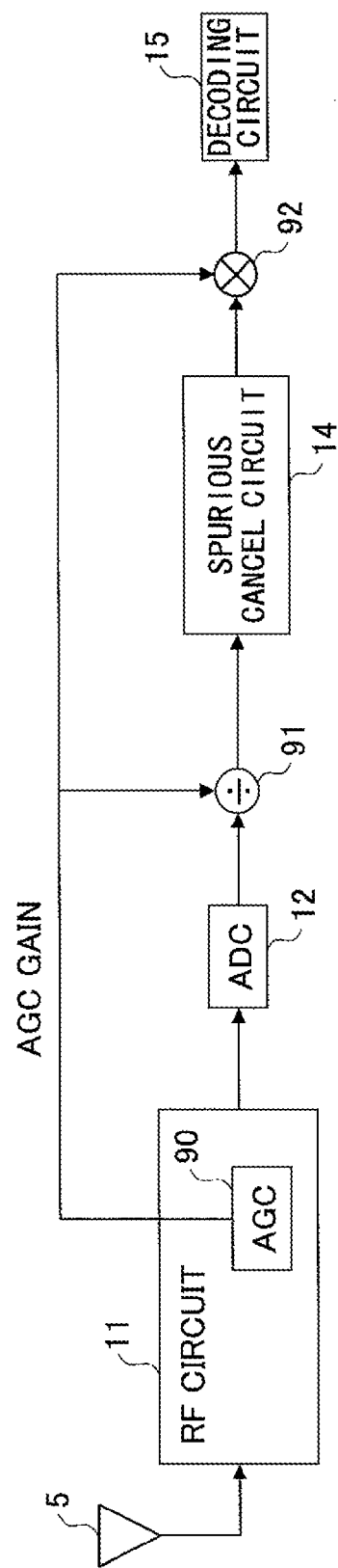
FIG. 8 is a drawing illustrating an example of the configuration of a signal processing circuit provided with a gain adjustment function.

FIG. 8 is a drawing illustrating an example of the configuration of a signal processing circuit provided with a gain adjustment function. This signal processing circuit is provided with a gain adjustment function for canceling a gain change made by automatic gain control such that a spurious signal is properly removed in a receiver which performs automatic gain control. The signal processing circuit illustrated in FIG. 8 includes the RF circuit 11, the AD converter 12, a division circuit 91, the spurious cancel circuit 14, a multiplication circuit 92, and the decoding circuit 15. The PLL circuit 13 is omitted from illustration in FIG. 8. Similarly to the configuration illustrated in FIG. 1, the PLL circuit 13 that supplies a sinusoidal wave signal to the rotor 25 and reverse rotor 27 of the spurious cancel circuit 14 may be provided.

The RF circuit 11 includes an AGC circuit 90. The AGC circuit 90 performs automatic gain control for controlling the gain of a received signal in response to the signal level of the received signal. The gain value (i.e., AGC gain) by which the AGC circuit 90 multiplies the received signal is supplied from the AGC circuit 90 to the division circuit 91 and the multiplication circuit 92. The division circuit 91 divides the digital baseband received signal AD-converted by the AD converter 12 by the gain value (i.e., AGC gain) supplied from the AGC circuit 90, thereby canceling the gain control performed by the automatic gain control. In this manner, the digital baseband received signal having a controlled gain is divided by the gain to generate a signal input into the PLL circuit and the spurious cancel circuit 14.

FIG. 7-(d) illustrates a spurious power 85 that is contained in the digital baseband received signal in which gain control is cancelled. Dividing the digital baseband received signal by the gain value (i.e., AGC gain) supplied from the AGC circuit 90 restores the constant amplitude of the spurious signal, so that the spurious power 85 has a constant power.

Referring to FIG. 8 again, the digital baseband received signal in which gain control is cancelled by the division circuit 91 is supplied to the PLL circuit 13 (see FIG. 1) and to the spurious cancel circuit 14. The digital baseband received signal in which gain control is cancelled has an almost constant spurious power. Similarly to the signal processing circuit illustrated in FIG. 1, the PLL circuit 13 and the spurious cancel circuit 14 can thus properly remove the spurious signal. The multiplication circuit 92 multiplies the digital baseband received signal having the spurious signal thereof removed by the spurious cancel circuit 14 by the gain value (i.e., AGC gain) supplied from the AGC circuit 90, thereby making automatic gain control effective again. The decoding circuit 15 receives the digital baseband received signal from which the spurious signal is removed by the spurious cancel circuit 14 and for which automatic gain control is enabled by the multiplication circuit 92, and performs a decoding process on the digital baseband received signal in accordance with the employed communication method.

According to at least one embodiment, the signal processing circuit removes a spurious signal without shifting the frequencies of a signal wave.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A signal processing circuit, comprising:
    a PLL circuit configured to lock to a frequency contained in an input signal;
    a signal generating circuit configured to detect a direct-current component of a signal that is obtained by shifting frequencies of the input signal by a displacement equal to the locked frequency, and to generate a signal that has an amplitude responsive to the detected direct-current component and that has the same frequency and phase as a signal component of the locked frequency of the input signal; and
    a subtraction circuit configured to subtract the signal generated by the signal generating circuit from the input signal.

2. The signal processing circuit as claimed in claim 1, wherein the PLL circuit supplies an oscillating signal having the same frequency and phase as the signal component of the locked frequency, and
    wherein the signal generating circuit includes:
    a first frequency shift circuit configured to shift frequencies of the input signal by a displacement equal to the locked frequency;
    a loop filter configured to receive as an input thereof an output of the frequency shift circuit; and
    a second frequency shift circuit configured to shift frequencies of an output of the loop filter by a displacement equal to the locked frequency based on the oscillating signal.

3. The signal processing circuit as claimed in claim 1, wherein the PLL circuit includes:
    a numerically controlled oscillator configured to generate an oscillating signal;
    a third frequency shift circuit configured to shift frequencies of the input signal by a displacement equal to a frequency of the oscillating signal; and
    a loop filter configured to receive as an input thereof an output of the third frequency shift circuit,
    wherein the numerically controlled oscillator is configured to generate the oscillating signal having a frequency responsive to an output of the loop filter.

4. The signal processing circuit as claimed in claim 1, further comprising a frequency sweeper circuit configured to control the numerically controlled oscillator to change the frequency of the oscillating signal.

5. The signal processing circuit as claimed in claim 1, further comprising:
    an automatic gain control circuit configured to control a gain of a received signal in response to a signal level of the received signal;
    a division circuit configured to divide the received signal having the controlled gain by the gain to generate the input signal; and
    a multiplication circuit configured to multiply an output of the subtraction circuit by the gain.

6. The signal processing circuit as claimed in claim 1, comprising a plurality of spurious removal circuits each including the PLL circuit, the signal generating circuit, and the subtraction circuit, wherein the spurious removal circuits are connected in series.

7. The signal processing circuit as claimed in claim 4, comprising a plurality of spurious removal circuits each including the PLL circuit, the signal generating circuit, and the subtraction circuit,
    wherein the spurious removal circuits are connected in series, and the frequency sweeper circuit is connected to one of the spurious removal circuits, and
    wherein the frequency sweeper circuit and the one of the spurious removal circuits detect a plurality of frequency components that are to be removed by the spurious removal circuits, respectively.

8. A signal processing method, comprising:
    causing a PLL circuit to lock to a frequency contained in an input signal;

detecting a direct-current component of a signal that is obtained by shifting frequencies of the input signal by a displacement equal to the locked frequency;

generating a signal that has an amplitude responsive to the detected direct-current component and that has the same frequency and phase as a signal component of the locked frequency of the input signal; and subtracting the generated signal from the input signal.

* * * * *